(12) United States Patent
Niwa

(10) Patent No.: US 10,964,658 B2
(45) Date of Patent: Mar. 30, 2021

(54) SEMICONDUCTOR DEVICE HAVING A METALLIC OXIDE OR METALLIC HYDROXIDE BARRIER LAYER

(71) Applicant: TOSHIBA MEMORY CORPORATION, Minato-ku (JP)

(72) Inventor: Keiichi Niwa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/552,166

(22) Filed: Aug. 27, 2019

(65) Prior Publication Data

US 2020/0266168 A1  Aug. 20, 2020

(30) Foreign Application Priority Data

Feb. 14, 2019  (JP) .................... 2019-024640

(51) Int. Cl.
*H01L 23/00* (2006.01)
*H01L 21/768* (2006.01)

(52) U.S. Cl.
CPC ........ *H01L 24/17* (2013.01); *H01L 21/76829* (2013.01); *H01L 21/76852* (2013.01); *H01L 24/09* (2013.01); *H01L 24/11* (2013.01); *H01L 2924/0105* (2013.01); *H01L 2924/01013* (2013.01); *H01L 2924/01029* (2013.01)

(58) Field of Classification Search
CPC ......... H01L 24/09; H01L 24/14; H01L 24/17; H01L 2224/13077; H01L 2224/17; H01L 2224/17505; H01L 23/3128; H01L 23/49816
See application file for complete search history.

(56) References Cited

U.S. PATENT DOCUMENTS

| 6,861,344 | B2 | 3/2005 | Yajima et al. |
| 9,190,348 | B2 | 11/2015 | Chen et al. |
| 9,269,688 | B2 * | 2/2016 | Wu ................... H01L 23/49827 |
| 2016/0148888 | A1 | 5/2016 | Ryu et al. |

FOREIGN PATENT DOCUMENTS

| JP | 2003-234348 A | 8/2003 |
| JP | 2003-258014 A | 9/2003 |
| JP | 2014-157906 A | 8/2014 |
| JP | 2018-46148 A | 3/2018 |

* cited by examiner

*Primary Examiner* — Hoai V Pham
(74) *Attorney, Agent, or Firm* — Oblon, McClelland, Maier & Neustadt, L.L.P.

(57) ABSTRACT

A semiconductor device according to an embodiment includes a substrate. An insulating film is provided above the substrate. Electrode pads are provided on the insulating film. Metallic bumps are respectively provided on surfaces of the electrode pads. A sidewall film comprises a metallic oxide or a metallic hydroxide provided on side surfaces of the metallic bumps. A barrier metal layer comprises first portions each provided between one of the metallic bumps and a corresponding one of the electrode pads and comprising a metal, and second portions provided at least on the electrode pads at a periphery of the metallic bumps and comprising a metallic oxide or a metallic hydroxide.

6 Claims, 10 Drawing Sheets

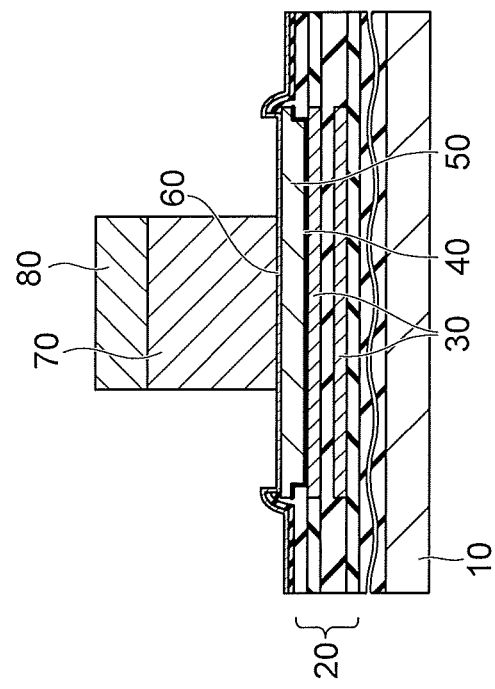
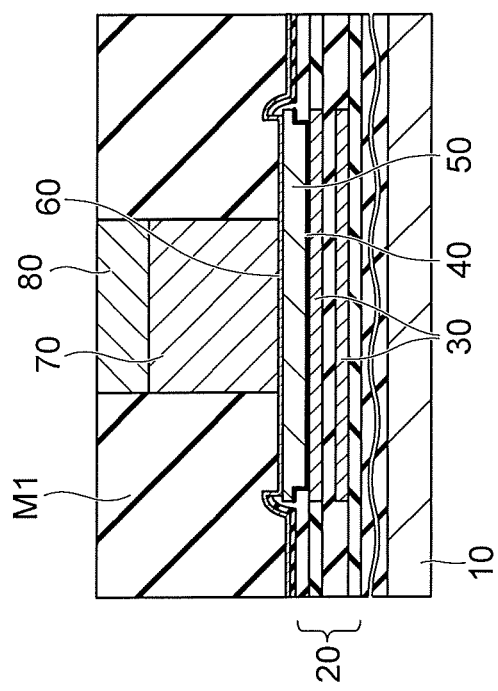

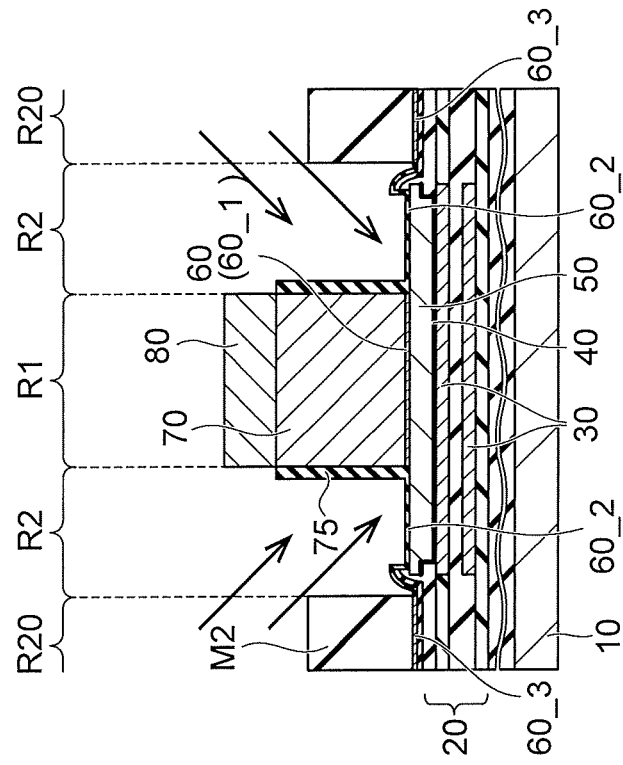
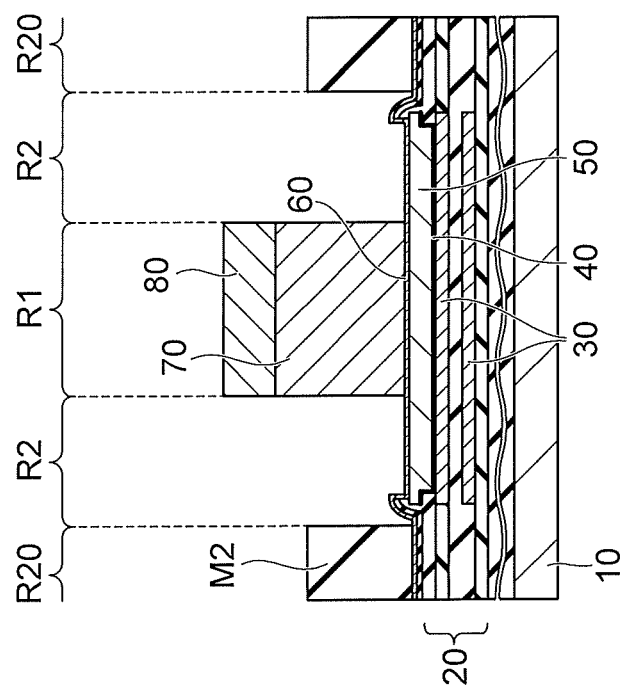

SEMICONDUCTOR DEVICE HAVING A METALLIC OXIDE OR METALLIC HYDROXIDE BARRIER LAYER

CROSS REFERENCE TO RELATED APPLICATIONS

This application is based upon and claims the benefit of priority from the prior Japanese Patent Application No. 2019-024640, filed on Feb. 14, 2019, the entire contents of which are incorporated herein by reference.

FIELD

The embodiments of the present invention relate to a semiconductor device and manufacturing method thereof.

BACKGROUND

Metallic bumps are sometimes formed on electrode pads of a semiconductor wafer to enable flip chip bonding. In order to form the metallic bumps, a barrier metal layer is formed on the electrode pads and the metallic bumps are formed on the barrier metal layer. After formation of the metallic bumps, the barrier metal layer needs to be removed to suppress a short circuit between the metallic bumps.

However, in the process of removing the barrier metal layer, there is a case where sidewalls of the metallic bumps are also etched and the metallic bumps are thinned. Furthermore, the surfaces of the electrode pads may corrode in the process of removing the barrier metal layer.

If the metallic bumps are thinned, there is a risk that the metallic bumps detach from the electrode pads or break. If the surfaces of the electrode pads corrode, the adhesiveness between a sealing resin and the electrode pads is degraded. These situations deteriorate the reliability of a semiconductor device.

BRIEF DESCRIPTION OF THE DRAWINGS

FIGS. 2A to 7B are sectional views illustrating an example of the manufacturing method of a semiconductor device according to the present embodiment;

DETAILED DESCRIPTION

Figure 1:
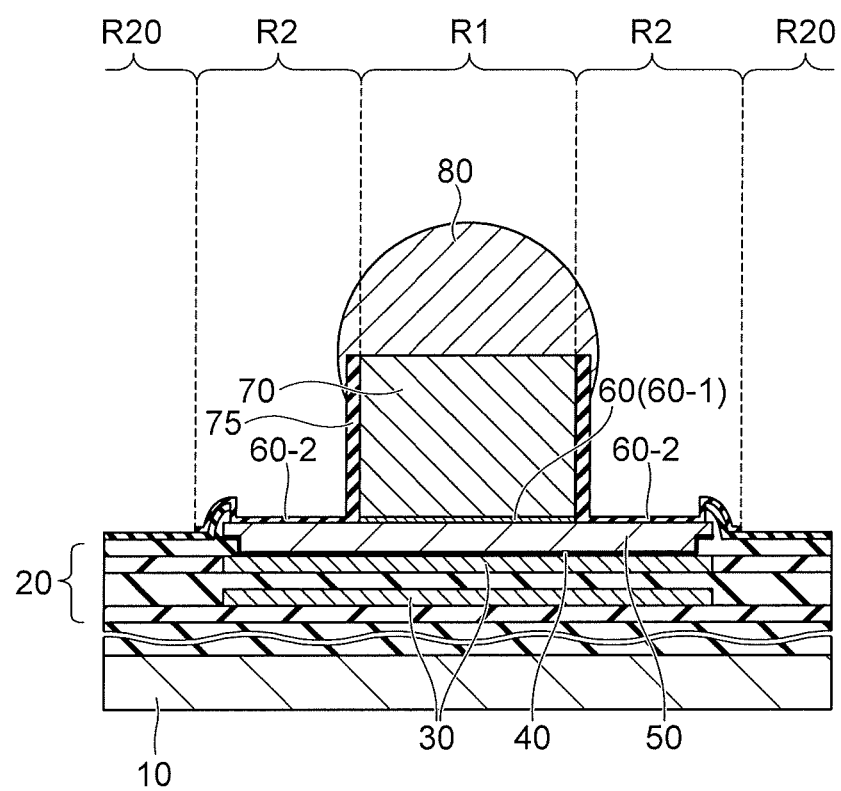
FIG. 1 is a sectional view illustrating a partial configuration of a semiconductor device according to the present embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment comprises a substrate. An insulating film is provided above the substrate. Electrode pads are provided on the insulating film. Metallic bumps are respectively provided on surfaces of the electrode pads. A sidewall film comprises a metallic oxide or a metallic hydroxide provided on side surfaces of the metallic bumps. A barrier metal layer comprises first portions each provided between one of the metallic bumps and a corresponding one of the electrode pads and comprising a metal, and second portions provided at least on the electrode pads at a periphery of the metallic bumps and comprising a metallic oxide or a metallic hydroxide.

FIG. 1 is a sectional view illustrating a partial configuration of a semiconductor device according to the present embodiment. A semiconductor device 1 can be, for example, a semiconductor chip or a semiconductor package such as a NAND flash memory. For the convenience sake, a metallic bump 70 and a metallic ball 80 in an unconnected state are illustrated in FIG. 1. However, the metallic bump 70 and the metallic ball 80 are stacked on another semiconductor chip or a mounting board by flip chip bonding. At this time, the metallic ball 80 is connected to an electrode pad of another semiconductor chip or a mounting board. The semiconductor chip is packaged and a sealing resin is provided around the metallic bump 70 and the metallic ball 80. In FIG. 1, illustrations of another semiconductor chip, a mounting board, and a sealing resin are omitted.

The semiconductor device 1 includes a semiconductor substrate 10, a plurality of interlayer dielectric films 20, a plurality of interconnections 30, barrier metal layers 40 and 60, electrode pads 50, the metallic bumps 70, a sidewall film 75, and the metallic balls 80.

Semiconductor elements (not illustrated) such as a memory cell array, a CMOS (Complementary Metal Oxide Semiconductor) circuit, a diode, a resistive element, and a capacitor are provided on the semiconductor substrate 10. The semiconductor substrate 10 is, for example, a silicon substrate.

The interlayer dielectric films 20 are provided above the semiconductor substrate 10 and cover the semiconductor elements. For example, an insulating film such as a silicon oxide film or a silicon nitride film is used as the interlayer dielectric films 20. The interconnections 30 are embedded in the interlayer dielectric films 20 and constitute a multi-layer interconnection structure. For example, a conductive metal such as copper or tungsten is used as the interconnections 30. The surface of the interconnection 30 of the topmost layer is exposed on the interlayer dielectric films 20 and is electrically connected to the electrode pads 50 via the barrier metal layer 40.

The barrier metal layer 40 is provided on the interconnection 30 of the topmost layer to suppress diffusion of a metallic material between the electrode pads 50 and the interconnections 30. For example, a stack film of titanium and tantalum is used as the barrier metal layer 40. The electrode pads 50 are provided on the barrier metal layer 40 and are electrically connected to the interconnections 30 via the barrier metal layer 40. For example, a conductive metal such as aluminum is primarily used as the electrode pads 50.

The barrier metal layer 60 is provided on the electrode pads 50 to form the metallic bumps 70 above the electrode pads 50. The metallic bumps 70 are provided on the barrier metal layer 60 and are electrically connected to the electrode pads 50 via the barrier metal layer 60.

The barrier metal layer 60 includes a barrier metal layer 60_1 being first portions respectively arranged between the metallic bumps 70 and the electrode pads 50, and a metallic oxide film 60_2 being second portions respectively arranged on the electrode pads 50 or the interlayer dielectric films 20 at the periphery of the metallic bumps 70. The barrier metal layer 60_1 is arranged in first regions R1 and the metallic oxide film 60_2 is arranged in second regions R2. The barrier metal layer 60 is removed in a region R20 other than the regions R1 and R2. Therefore, the metallic bumps 70 adjacent to each other are electrically isolated from each other. The regions R1 are regions where the metallic bumps 70 are formed. The regions R2 are positioned at the periphery of the metallic bumps 70 and the outer borders thereof are positioned outside the corresponding electrode pads 50. That is, a combination of one of the regions R1 and the relevant region R2 is a region including the corresponding electrode pad 50 and being substantially the same as or wider than the electrode pad 50.

For example, a stack film of titanium and copper is used as the barrier metal layer 60_1. The metallic oxide film 60_2 is, for example, a stack film of titanium (or a titanium oxide) and a copper oxide.

The metallic bumps 70 are arranged above the corresponding electrode pads 50 and are electrically connected to the electrode pads 50 via the barrier metal layer 60_1. The sidewall film 75 is provided on the side surfaces of the metallic bumps 70. The sidewall film 75 is constituted by an oxide or a hydroxide of the material of the metallic bumps 70 (for example, a copper oxide or a copper hydroxide). The sidewall film 75 covers the side surfaces of the metallic bumps 70 to suppress side etching of the metallic bumps 70 in a process of etching the barrier metal layer 60 in a manufacturing process of the semiconductor device 1. The metallic balls 80 are provided on the metallic bumps 70, respectively.

The barrier metal layer 60 (60_1 and 60_2) is left also on the electrode pads 50 and the interlayer dielectric films 20 at the periphery of the metallic bumps 70 in the regions R2 as well as under the metallic bumps 70 in the regions R1. That is, the barrier metal layer 60 is provided in a range wider than the bottom area of the metallic bumps 70 and is provided so as to cover the surfaces of the electrode pads 50. Therefore, the area of the barrier metal layer 60 covering the electrode pads 50 and the interlayer dielectric films 20 (the area of the regions R1 and R2) is larger than a contact area between the electrode pads 50 and the metallic bumps 70 (the area of the regions R1) by the metallic oxide film 60_2. The metallic oxide film 60_2 covers the surfaces of the electrode pads 50 to suppress etching of the surfaces of the electrode pads 50 in the etching process of the barrier metal layer 60.

Due to this protection of the side surfaces of the metallic bumps 70 and the surfaces of the electrode pads 50 with the sidewall film 75 and the metallic oxide film 60_2, thinning of the metallic bumps 70 and corrosion of the electrode pads 50 can be suppressed in the etching process of the barrier metal layer 60. As a result, the semiconductor device 1 according to the present embodiment can obtain a high reliability.

A manufacturing method of a semiconductor device according to the present embodiment is explained next.

FIGS. 2A to 7B are sectional views illustrating an example of the manufacturing method of a semiconductor device according to the present embodiment. First, semiconductor elements (not illustrated) are formed on a semiconductor substrate 10. The semiconductor substrate 10 can be, for example, a silicon substrate. The semiconductor elements can be, for example, a memory cell array, a transistor, a diode, a resistive element, or a capacitor.

Figure 2B:
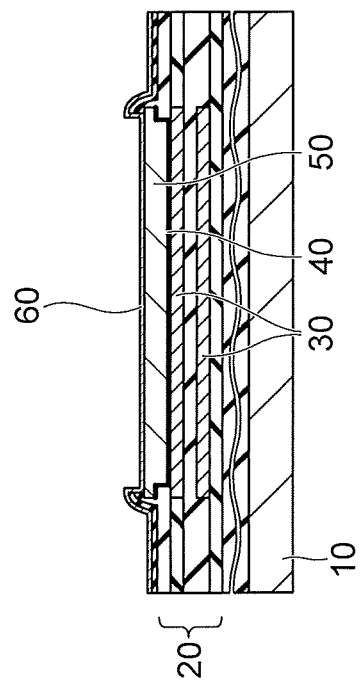
Figure 2A:
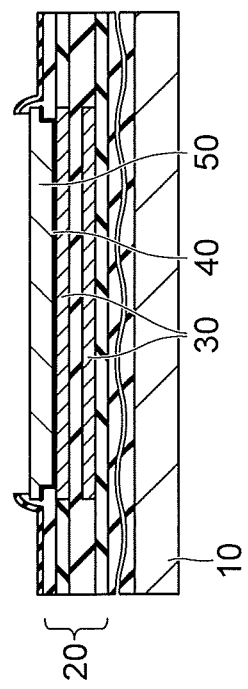

Next, the interlayer dielectric films 20 and the interconnections 30 are formed above the semiconductor substrate 10 and the semiconductor elements as illustrated in FIG. 2A. The interlayer dielectric films 20 and the interconnections 30 are stacked and constitute a multi-layer interconnection structure. For example, an insulating material such as a silicon oxide film or a silicon nitride film is used as the interlayer dielectric films 20. A conductive metal such as copper or tungsten is used as the interconnections 30, for example. The surface of the interconnection 30 of the topmost layer is electrically connected to the electrode pads 50 via the barrier metal layer 40.

The barrier metal layer 40 is formed on the interconnection 30 of the topmost layer as a diffusion prevention layer between the electrode pads 50 and the interconnections 30. For example, a stack film of titanium and tantalum is used as the barrier metal layer 40. The barrier metal layer 40 functions as the diffusion prevention film to prevent the materials of the electrode pads 50 and the interconnections 30 from diffusing to each other.

The electrode pads 50 are respectively formed on the interconnections 30 and the barrier metal layer 40 with the barrier metal layer 40 used as the diffusion prevention layer. The electrode pads 50 are electrically connected to the interconnections 30. For example, a conductive metal such as aluminum is primarily used as the electrode pads 50.

Next, the barrier metal layer 60 is formed on the surfaces of the electrode pads 50 and the interlayer dielectric films 20 as illustrated in FIG. 2B. The barrier metal layer 60 is formed, for example, using a sputtering method. The barrier metal layer 60 functions also as a seed layer for the metallic bumps 70 illustrated in FIG. 3B. For example, a stack film of a titanium film provided on the electrode pads 50 and a copper film provided on the titanium film is primarily used as the barrier metal layer 60. The configuration of the barrier metal layer 60 is not limited only to the stack film of titanium and copper.

Figure 3A:
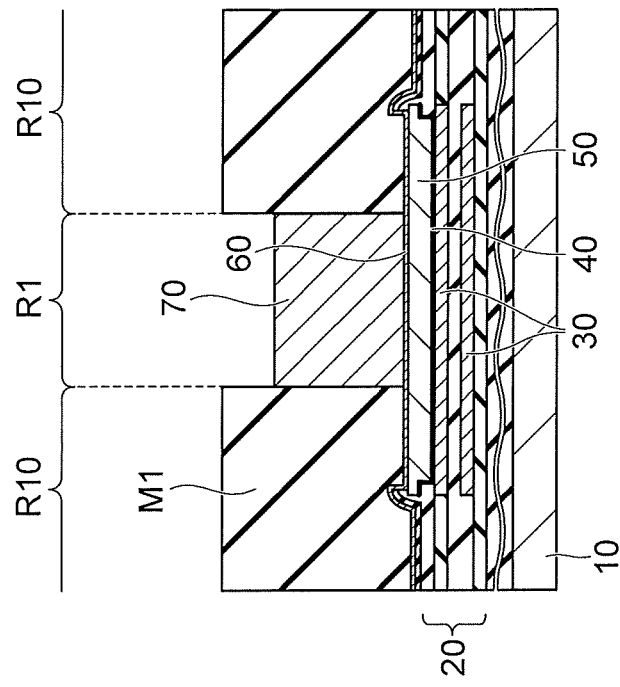

Next, as illustrated in FIG. 3A, a lithography technique is used to coat a first mask material M1 on the electrode pads 50 and the interlayer dielectric films 20 and to pattern the first mask material Ml. Accordingly, the first mask material M1 on portions of the surfaces of the electrode pads 50 arranged in regions (the first regions) R1 where the metallic bumps 70 are formed is removed. The first mask material M1 covers a region R10 other than the first regions R1. The region R10 includes regions on the electrode pads 50 where the metallic bumps 70 are not formed and regions of the interlayer dielectric films 20.

Figure 3B:
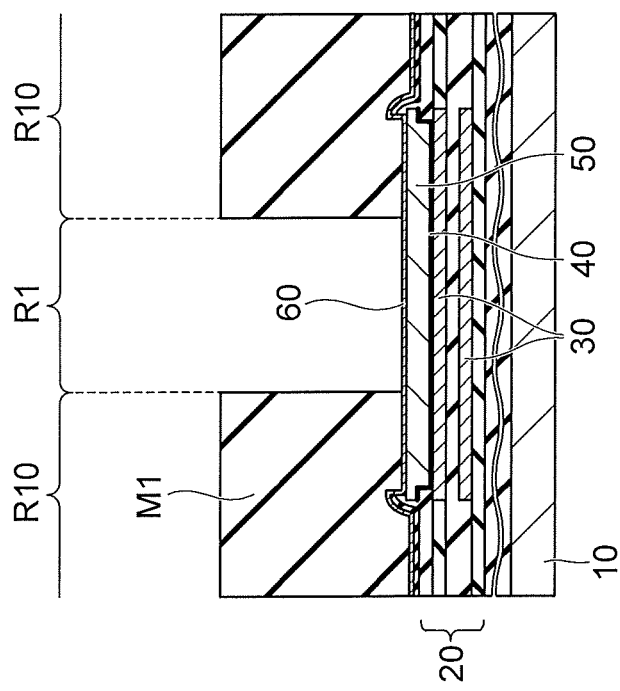

Next, as illustrated in FIG. 3B, a material of the metallic bumps 70 is selectively deposited on the formation regions R1 of the metallic bumps 70 using the first mask material M1 as a mask. For example, a conductive metal such as copper is primarily used as the metallic bumps 70. The metallic bumps 70 are formed on the barrier metal layer 60, for example, by an electrolytic plating method or a non-electrolytic plating method.

Subsequently, as illustrated in FIG. 4A, a material of the metallic balls 80 is deposited on the metallic bumps 70 using the first mask material M1 as a mask. For example, a conductive metal such as solder (tin) is used as the metallic balls 80. Also the metallic balls 80 are formed, for example, by the electrolytic plating method or the non-electrolytic plating method on the metallic bumps 70.

Next, the first mask material M1 is removed, whereby a structure illustrated in FIG. 4B is obtained.

Next, a lithography technique is used to coat a second mask material M2 on the interlayer dielectric films 20 and the barrier metal layer 60 and remove the second mask material M2 in surface regions (the second regions) R2 of the electrode pads 50 at the periphery of the metallic bumps 70 as illustrated in FIG. 5A. Accordingly, the barrier metal layer 60 arranged in the region R10 of the electrode pads 50 and the interlayer dielectric films 20 at the periphery of the metallic bumps 70 is exposed. On the other hand, the barrier metal layer 60 arranged in the region R20 of the interlayer dielectric films 20 other than the regions R2 is covered with the second mask material M2. The barrier metal layer 60 arranged in the regions R1 is covered with the metallic bumps 70.

Subsequently, as illustrated in FIG. 5B, the side surfaces of the metallic bumps 70 and the barrier metal layer 60 exposed in the regions R2 are surface-treated by plasma of oxygen-containing gas using the second mask material M2 as a mask. Hereinafter, this treatment can be referred to as ashing treatment. The ashing treatment oxidizes the side surfaces of the metallic bumps 70 and the barrier metal layer 60 in the regions R2. Therefore, the sidewall film 75 constituted by a metallic oxide film is formed on the side surfaces of the metallic bumps 70. When the metallic bumps 70 are copper, the sidewall film 75 is a copper oxide. The barrier metal layer 60 exposed in the regions R2 is selectively oxidized. Accordingly, the metallic oxide film 60_2 being the second portions is formed in the regions R2. When the barrier metal layer 60 has a stack structure including copper and titanium, copper and/or titanium is oxidized in the regions R2. Accordingly, the metallic oxide film 60_2 becomes a stack film of a copper oxide and titanium (or a titanium oxide). On the other hand, the barrier metal layer 60 in the regions R1 and R20 covered with the second mask material M2 and the metallic bumps 70 is not oxidized. That is, the barrier metal layer 60 is selectively subjected to the ashing treatment using the metallic bumps 70 and the second mask material M2 as a mask, whereby the barrier metal layer 60 in the regions R2 not covered with the second mask material M2 and the metallic bumps 70 is selectively oxidized. Unoxidized portions (the first portions) of the barrier metal layer 60 arranged under the metallic bumps 70 in the regions R1 are referred to as the barrier metal layer 60_1 for the convenience sake. Oxidized portions of the barrier metal layer 60 in the regions R2 are referred to as the metallic oxide film 60_2 for the convenience sake. An unoxidized portion of the barrier metal layer 60 arranged on the interlayer dielectric films 20 in the region R20 is referred to as a barrier metal layer 60_3 for the convenience sake.

Figure 6A:
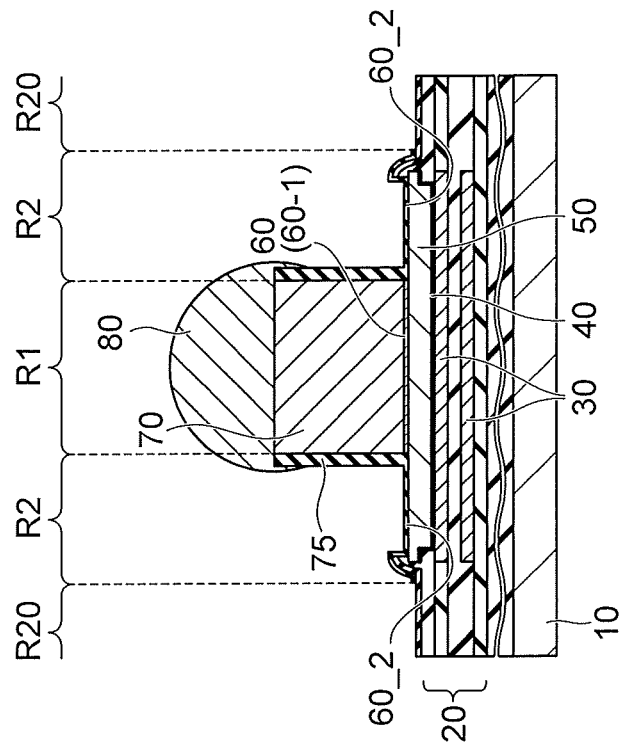

After the second mask material M2 is removed, the barrier metal layer 60 is etched by wet etching as illustrated in FIG. 6A. An etchant is a liquid that dissolves copper and titanium and is, for example, a liquid obtained by adding an additive and water to an organic acid or a liquid obtained by adding an additive and water to a hydroxide. At this time, the sidewall film 75 and the metallic oxide film 60_2 are left and the barrier metal layer 60_3 arranged in the region R20 is selectively removed. The barrier metal layer 60_1 arranged under the metallic bumps 70 is of course left. Two kinds of etchants may be used in such a manner that copper is dissolved with an etchant that dissolves copper and thereafter titanium is dissolved with another etchant that dissolves titanium. There are various other etchants than the etchant containing an organic acid and the etchant containing a hydroxide described above, and these etchants may be used.

There is a risk that the etchant corrodes the metallic bumps 70 or the electrode pads 50. However, according to the present embodiment, the side surfaces of the metallic bumps 70 are covered with the sidewall film 75 and the surfaces of the electrode pads 50 and the interlayer dielectric films 20 in the regions R2 are covered with the metallic oxide film 60_2. As will be explained later with reference to FIG. 8, a copper oxide and a titanium oxide have lower etching rates than those of copper and titanium. Therefore, the side surfaces of the metallic bumps 70 are protected by the sidewall film 75 and the surfaces of the electrode pads 50 are protected by the metallic oxide film 60_2. Accordingly, the barrier metal layer 60 in the region R20 can be selectively removed while thinning of the metallic bumps 70 is suppressed and corrosion of the electrode pads 50 is suppressed.

As described above, the outer borders of the regions R2 are positioned outside the corresponding electrode pads 50. Therefore, the barrier metal layer 60_1 and the metallic oxide film 60_2 cover the entire surfaces of the electrode pads 50. This protects the entire electrode pads 50 and can suppress corrosion thereof.

Figure 6B:
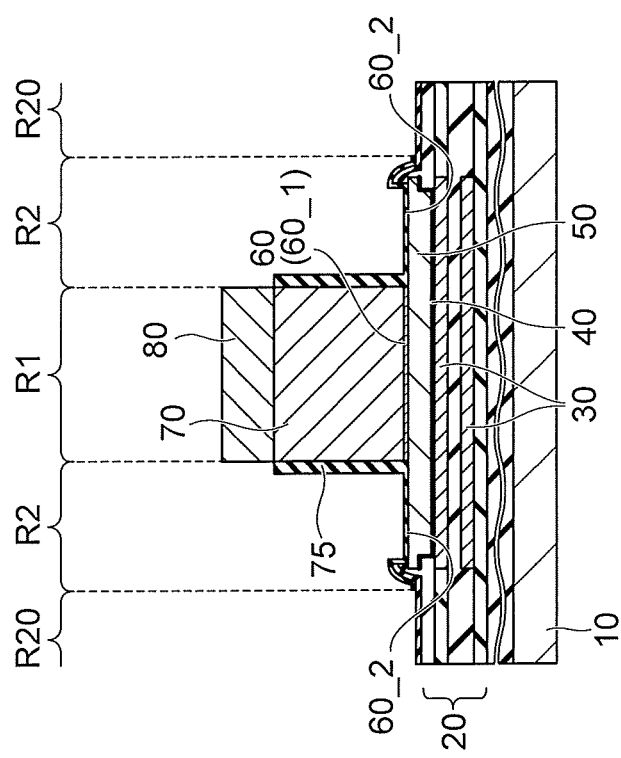

Next, as illustrated in FIG. 6B, the metallic balls 80 are reflowed by thermal treatment. Accordingly, the metallic balls 80 have a substantially spherical shape.

Thereafter, the semiconductor substrate 10 is diced to singulate semiconductor chips out of the semiconductor substrate 10. A semiconductor chip is stacked on another semiconductor chip or a mounting board by flip chip bonding. At this time, the metallic balls 80 on the metallic bumps 70 are respectively connected to electrode pads of another semiconductor chip or a mounting board. Accordingly, the interconnections 30 are electrically connected to interconnections of another semiconductor chip or a mounting board.

Figure 7A:
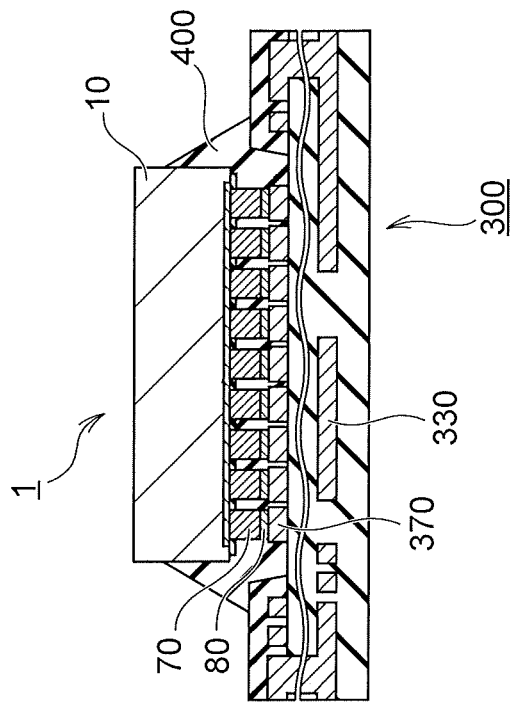
Figure 7B:
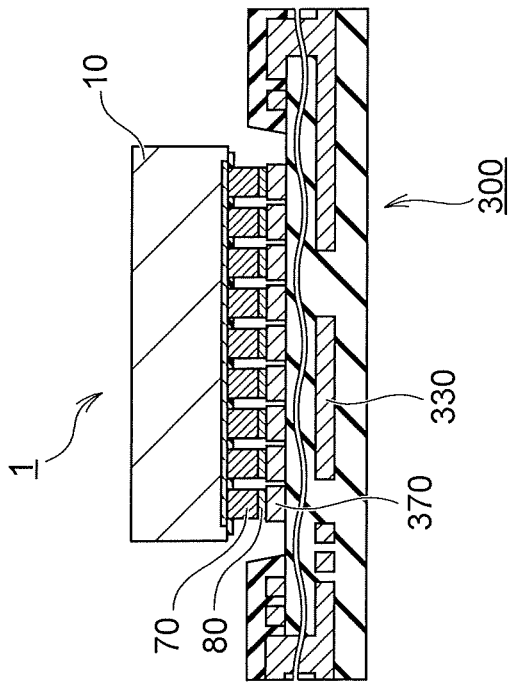

FIG. 7A is a diagram illustrating the metallic balls 80 connected to electrode pads 370 of a mounting board 300. In this way, the semiconductor device 1 can be connected as a semiconductor chip to the mounting board 300. The mounting board 300 has interconnection layers 330 therein. FIGS. 7A and 7B illustrate an outline of the semiconductor device 1. Although not illustrated, the semiconductor device 1 may be flip-chip connected to another semiconductor chip.

Next, as illustrated in FIG. 7B, a resin 400 is filled in between the semiconductor device 1 and the mounting board 300, whereby the metallic bumps 70 and the metallic balls 80 are protected and connection between the metallic balls 80 and the electrode pads 370 of the mounting board 300 is protected. The semiconductor device according to the present embodiment is thus completed.

Figure 8:
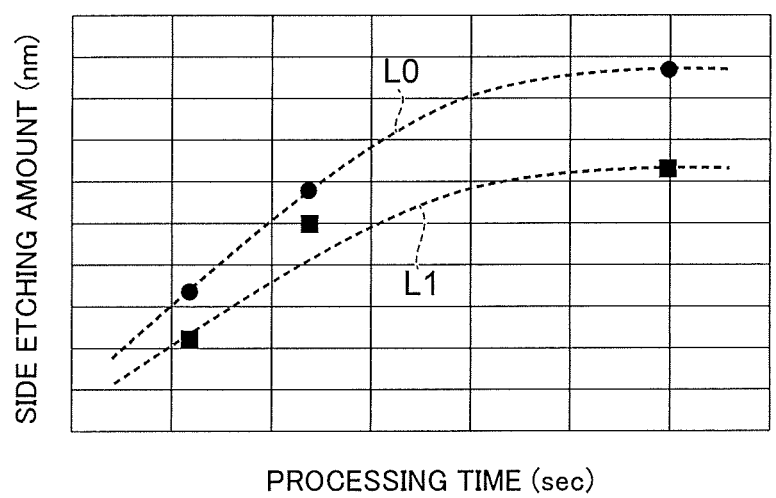
FIG. 8 is a graph indicating side etching amounts of the metallic bumps in the etching process of the barrier metal layer.

FIG. 8 is a graph indicating side etching amounts of the metallic bumps 70 in the etching process of the barrier metal layer 60_3 explained with reference to FIG. 6A. The vertical axis represents the side etching amount of the metallic bumps 70. The horizontal axis represents the etching processing time. The etchant is a liquid obtained by adding an additive and water to an organic acid or a liquid obtained by adding an additive and water to a hydroxide.

A line L0 indicates the side etching amount in a case where the ashing treatment is not performed before the etching process of the barrier metal layer 60_3. That is, the line L0 indicates the side etching amount of the metallic bumps 70 in a case where the sidewall film 75 is not provided. A line L1 indicates the side etching amount in a case where the ashing treatment is performed before the etching process of the barrier metal layer 60_3. That is, the line L1 indicates the side etching amount of the metallic bumps 70 in a case where the sidewall film 75 is provided.

As can be seen from this graph, the side etching amount of the metallic bumps 70 is reduced when the sidewall film 75 is provided. Accordingly, thinning of the metallic bumps 70 is suppressed and the width of the metallic bumps 70 can be maintained. Similarly, the etching rate of the metallic oxide film 60_2 is also lower than that of the unoxidized portion of the barrier metal layer 60 and corrosion of the surfaces of the electrode pads 50 can be suppressed.

In the embodiment described above, the sidewall film 75 and the metallic oxide film 60_2 are, for example, a metallic oxide such as a copper oxide (CuO). However, the sidewall film 75 may be, for example, a metallic hydroxide such as a copper hydroxide (CuOH). The film 60_2 also may be a metallic hydroxide film. For example, at the time of the ashing treatment, the sidewalls of the metallic bumps 70 and the barrier metal layer 60 are sometimes oxidized and hydroxylated due to oxygen and moisture in the air. Therefore, the films 75 and 60_2 sometimes become a mixture of a metallic oxide and a metallic hydroxide. Even if the films 75 and 60_2 are such a mixture of a metallic oxide and a metallic hydroxide, the films 75 and 60_2 can function as a protection film for the metallic bumps 70 and the electrode pads 50 in the etching process. In a case where a larger amount of hydroxide is to be obtained, water vapor as well as oxygen gas may be introduced to perform the ashing treatment.

There is a case where the barrier metal layer 60 is exposed to atmosphere or water, is exposed to plasma of oxygen-containing gas for surface cleaning, or is exposed to a cleaning solution of an acid or an alkali in processes before the metal bumps 70 are formed. Due to such an exposure, the barrier metal layer 60_1 in the regions R1 may be oxidized or hydroxylated and contain a small amount of metallic oxide and metallic hydroxide. In this case, the contained amounts of the metallic oxide and the metallic hydroxide in the barrier metal layer 60_1 are smaller than those of the metallic oxide and the metallic hydroxide in the metallic oxide film 60_2.

(First Modification)

Figure 9:
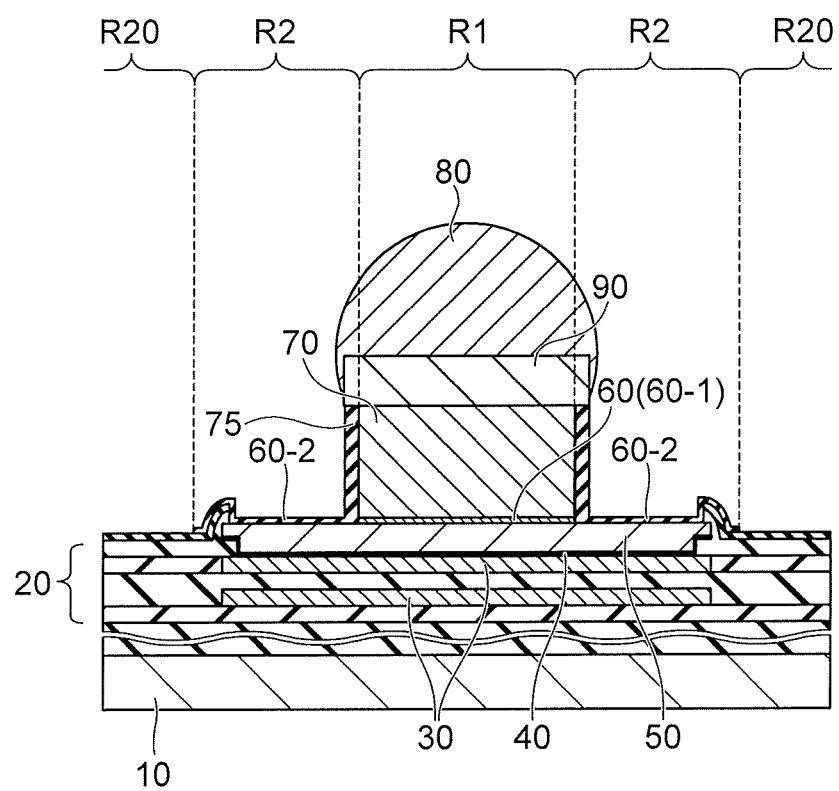
FIG. 9 is a sectional view illustrating a configuration example of a first modification of the embodiment described above.

FIG. 9 is a sectional view illustrating a configuration example of a first modification of the embodiment described above. In the embodiment described above, the metallic balls 80 are provided on the metallic bumps 70 so as to be in direct contact therewith. In contrast thereto, in the present modification, a diffusion prevention film 90 is provided between the metallic balls 80 and the corresponding metallic bumps 70. For example, a conductive metal such as nickel is used as the diffusion prevention film 90. The diffusion prevention film 90 prevents copper or tin from mutually diffusing between the metallic bumps 70 and the metallic balls 80. Other configurations of the present modification can be identical to corresponding ones of the embodiment described above.

It suffices to form the diffusion prevention film 90 on the metallic bumps 70 after deposition of the metallic bumps 70 in the process illustrated in FIG. 3B. The metallic balls 80 are thereafter formed on the diffusion prevention film 90. Other manufacturing processes of the present modification can be identical to those of the embodiment described above.

As described above, the effect of the present embodiment is not lost even if the diffusion prevention film 90 is provided between the metallic balls 80 and the corresponding metallic bumps 70.

(Second Modification)

Figure 10A:
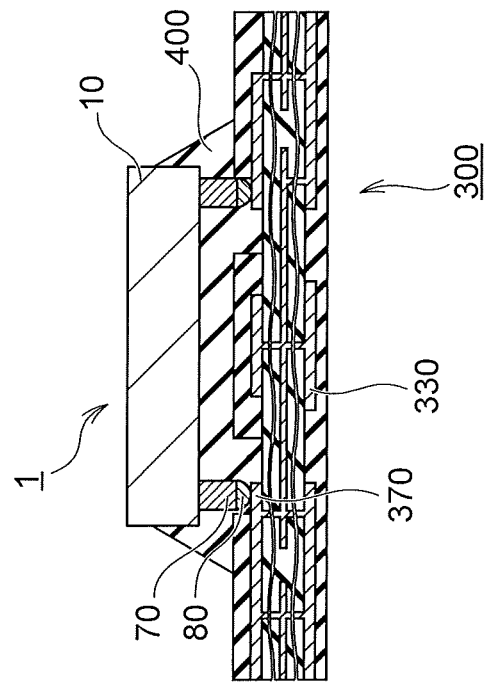
FIGS. 10A and 10B are sectional views illustrating a configuration example of a second modification of the embodiment described above.
Figure 10B:
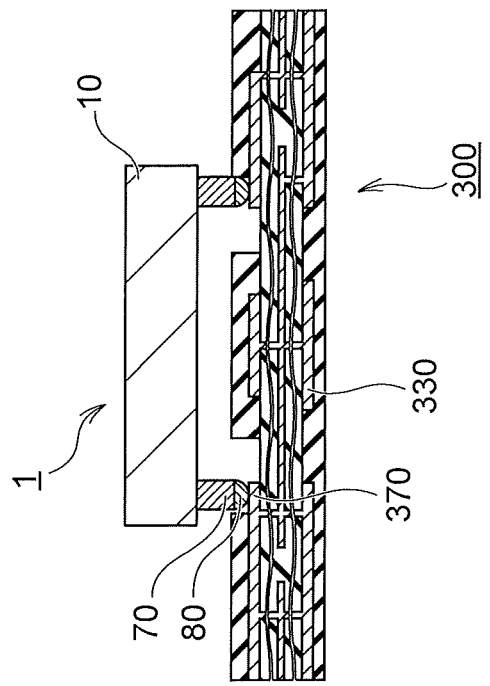

FIGS. 10A and 10B are sectional views illustrating a configuration example of a second modification of the embodiment described above. In the second modification, the metallic bumps 70 and the metallic balls 80 are provided only on both lateral sides of the semiconductor device 1 and are fewer than the metallic bumps 70 and the metallic balls 80 in the embodiment described above. Other configurations of the second modification can be identical to those of the embodiment described above. The semiconductor device 1 can be provided in the mode described here.

Next, as illustrated in FIG. 10B, the resin 400 is filled in between the semiconductor device 1 and the mounting board 300, whereby the metallic bumps 70 and the metallic balls 80 are protected and connection between the metallic balls 80 and the corresponding electrode pads 370 of the mounting board 300 is protected. In this manner, the semiconductor device according to the second modification is completed.

As described above, the effect of the present embodiment is not lost even if arrangement of the metallic bumps 70 and the metallic balls 80 is changed in any manner depending on the mode of the mounting board 300 or the mode of another semiconductor chip.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate;
an insulating film provided above the substrate;
electrode pads provided on the insulating film;
metallic bumps respectively provided on surfaces of the electrode pads;
a sidewall film comprising a metallic oxide or a metallic hydroxide provided on side surfaces of the metallic bumps; and
a barrier metal layer comprising first portions each provided between one of the metallic bumps and a corresponding one of the electrode pads and comprising a metal, and second portions provided at least on the electrode pads at a periphery of the metallic bumps and comprising a metallic oxide or a metallic hydroxide.

2. The device of claim 1, wherein the barrier metal layer has an area larger than a contact area between the electrode pads and the metallic bumps.

3. The device of claim 2, wherein
the electrode pads comprise aluminum,
the metallic bumps comprise copper,
the sidewall film comprises a copper oxide or a copper hydroxide,
the first portions are a stack film of titanium and copper, and
the second portions are a stack film of titanium and a copper oxide or a copper hydroxide.

4. The device of claim 1, wherein
the electrode pads comprise aluminum,
the metallic bumps comprise copper, the sidewall film comprises a copper oxide or a copper hydroxide, the first portions are a stack film of titanium and copper, and the second portions are a stack film of titanium and a copper oxide or a copper hydroxide.

5. The device of claim 1, further comprising metallic balls respectively provided on the metallic bumps, and a diffusion prevention film provided between the metallic balls and the metallic bumps.

6. The device of claim 5, wherein the metallic balls comprise tin, and the diffusion prevention film comprises nickel.

* * * * *